(12) United States Patent
Kong (10) Patent No.: US 8,593,217 B1
(45) Date of Patent: Nov. 26, 2013

(54) FINITE INPUT RESPONSE FILTER IN A VOLTAGE-MODE DRIVER

(75) Inventor: Lingkai Kong, El Cerrito, CA (US)

(73) Assignee: Xilinx, Inc., San Jose, CA (US)

( * ) Notice: Subject to any disclaimer, the term of this patent is extended or adjusted under 35 U.S.C. 154(b) by 5 days.

(21) Appl. No.: 13/411,446

(22) Filed: Mar. 2, 2012

(51) Int. Cl.
*H03K 5/00* (2006.01)

(52) U.S. Cl.
USPC .......................................... 327/554; 708/819

(58) Field of Classification Search
USPC .................................. 327/551–559; 708/819
See application file for complete search history.

(56) References Cited

U.S. PATENT DOCUMENTS

| | | | |
|---|---|---|---|
| 6,704,818 B1 | 3/2004 | Martin et al. | |
| 7,948,272 B2 * | 5/2011 | Lee et al. | 327/77 |
| 8,233,871 B2 * | 7/2012 | Keehr et al. | 455/285 |
| 2006/0170478 A1 * | 8/2006 | Jung | 327/276 |

OTHER PUBLICATIONS

Philpott, R.A. et al., a 20Gb/s SerDes Transmitter with Adjustable Source Impedance and 4-tap Feed-Forward Equalization in 65nm Bulk CMOS, IEEE 2008 Custom Integrated Circuits Conference, 2008, CICC 2008, IEEE, Sep. 21-24, 2008, pp. 623-626.

Dettloff, et al., A 32m W 7.4Gb/s protocol-Agile Source-Series-Terminated Transmitter in 45nm CMOS SOI, 2010 IEEE International Solid State Circuits Conference of Technical Papers (ISSCC), Feb. 7-11, 2010, pp. 370-371.

\* cited by examiner

*Primary Examiner* — Dinh T. Le
(74) *Attorney, Agent, or Firm* — Gerald Chan (57) ABSTRACT

A FIR filter component for a voltage mode driver includes a first node, a second node, and a first switching component comprising a first transistor having a first drain/source, a gate, and a second drain/source, and also a second transistor having a first drain/source, a gate, and a second drain/source. The FIR filter component also includes a first tunable resistor coupled between the first node and a first potential, and a second tunable resistor coupled between the second node and a second potential, wherein the FIR filter component is configured to generate a first output signal at the first output node.

18 Claims, 5 Drawing Sheets

FINITE INPUT RESPONSE FILTER IN A VOLTAGE-MODE DRIVER

FIELD OF THE INVENTION

An embodiment relates generally to integrated circuits, and in particular to implementing a finite input response (FIR) filter in a voltage-mode driver.

BACKGROUND

In the context of high speed input/output (I/O) for computer systems whereby data is communicated over a bus, integrated circuits are used. Typically, such integrated circuits include a data transmitter, or driver circuit, and a receiver circuit. Such driver circuits can be implemented as current mode drivers or voltage mode drivers. Voltage mode drivers are known to consume far less power in comparison to current mode drivers. Generally, a current mode driver will require 4 times the DC power of its voltage mode counterpart to provide the same output swing.

While voltage mode drivers typically consume less power than current mode drivers, this is not the case where the voltage mode driver implements a finite impulse response (FIR) filter. A FIR filter is used to compensate for channel losses (e.g., from transmission over a PCI bus) and provides frequency dependent voltage adjustment to input signals being fed to the driver. Prior approaches to implementing an FIR filter in a voltage mode driver involved partitioning the driver into several different segments, wherein each segment may have a particular configuration and a combination of the different segment configurations determines the frequency dependent voltage adjustment of input signals fed to the driver. Under this approach, in order to provide high resolution frequency dependent voltage adjustment, a large amount of segmenting is required. Because of the minimum device limit, a large amount of segmenting will result in an increased amount of power consumed by the voltage mode driver thereby eliminating the power consumption advantages typically attributed to voltage mode drivers.

SUMMARY

An embodiment of a FIR filter component for a voltage mode driver includes a first node, a second node, and a first switching component comprising a first transistor having a first drain/source, a gate, and a second drain/source, a second transistor having a first drain/source, a gate, and a second drain/source, wherein the first drain/source of the first transistor is coupled to the first node, the second drain/source of the first transistor is coupled to a first output node, the first drain/source of the second transistor is coupled to the first output node, the second drain/source of the second transistor is coupled to the second node, and the gates of the first and second transistor are coupled to a first input signal. The FIR filter component also includes a first tunable resistor coupled between the first node and a first potential, and a second tunable resistor coupled between the second node and a second potential, wherein the FIR filter component is configured to generate a first output signal at the first output node.

In one or more embodiments, the first potential may be a supply voltage.

In one or more embodiments, the second potential may be ground.

In one or more embodiments, a range of resistance values associated with the first tunable resistor and a range of resistance values associated with the second tunable resistor may be the same.

In one or more embodiments, a range of resistance values associated with the first tunable resistor and a range of resistance values associated with the second tunable resistor may be different.

In one or more embodiments, the FIR filter component may further include a second switching component comprising a third transistor having a first drain/source, a gate, and a second drain/source, and a fourth transistor having a first drain/source, a gate, and a second drain/source, wherein the first drain/source of the third transistor is coupled to the first node, the second drain/source of the third transistor is coupled to a second output node, the first drain/source of the fourth transistor is coupled to the second output node, the second drain/source of the fourth transistor is coupled to the second node, and the gates of the third and fourth transistor are coupled to a second input signal, and wherein the FIR filter component is further configured to generate a second output signal at the second output node.

In one or more embodiments, the first transistor and third transistor may be PMOS transistors, and the second transistor and fourth transistor may be NMOS transistors.

In one or more embodiments, the first input signal and second input signal may be a pair of differential input signals.

Another embodiment of a FIR filter arrangement for a voltage mode driver includes two or more FIR filter components, wherein each of the two or more FIR filter components comprises a first node, a second node, a first switching component comprising a first transistor having a first drain/source, a gate, and a second drain/source, and a second transistor having a first drain/source, a gate, and a second drain/source, wherein the first drain/source of the first transistor is coupled to the first node, the second drain/source of the first transistor is coupled to a first output node, the first drain/source of the second transistor is coupled to the first output node, the second drain/source of the second transistor is coupled to the second node, and the gates of the first and second transistor are coupled to a first input signal. Each of the two or more FIR filter may also comprise a first tunable resistor coupled between the first node and a first potential, and a second tunable resistor coupled between the second node and a second potential, wherein the first switching component is configured to generate a first output signal at the first output node, and wherein the first output nodes of each of the two or more FIR filter components are shared such that the first output signals generated by each of the two or more FIR filter components are combined.

In one or more embodiments, the first potential of each of the two or more FIR filter components may be a supply voltage.

In one or more embodiments, the second potential of each of the two or more FIR filter components may be ground.

In one or more embodiments, a range of resistance values associated with the first tunable resistor and a range of resistance values associated with the second tunable resistor may be the same for each of the two or more FIR filter components.

In one or more embodiments, each of the two or more FIR filter components may further include a second switching component comprising a third transistor having a first drain/source, a gate and a second drain/source, and a fourth transistor having a first drain/source, a gate, and a second drain/source, wherein the first drain/source of the third transistor is coupled to the first node, the second drain/source of the third transistor is coupled to a second output node, the first drain/source of the fourth transistor is coupled to the second output node, the second drain/source of the fourth transistor is coupled to the second node, and the gates of the third and fourth transistor are coupled to a second input signal, and wherein the second switching component is configured to generate a second output signal at the second output node.

In one or more embodiments, the first transistor and third transistor of each of the two or more FIR filter components may be PMOS transistors, and the second transistor and fourth transistor of each of the two or more FIR filter components may be NMOS transistors.

In one or more embodiments, the first input signal and second input signal of each of the two or more FIR filter components may be a pair of differential input signals.

In one or more embodiments, the second output nodes of each of the two or more FIR filter components may be shared such that the second output signals generated by each of the two or more FIR filter components may be combined.

In one or more embodiments, the two or more FIR filter components may comprise three FIR filter components.

In one or more embodiments, the three FIR filter components may comprise a pre-cursor FIR filter component, a main cursor FIR filter component, and a post cursor FIR filter component.

In one or more embodiments, the gates of the first and second transistor of the pre-cursor FIR filter component may be coupled to a first time-advanced input signal, the gates of the third and fourth transistor of the pre-cursor FIR filter component may be coupled to a second time-advanced input signal, and the pre-cursor FIR filter component may be configured to generate a first time-advanced output signal at the first output node and a second time-advanced output signal at the second output node, the gates of the first and second transistor of the main cursor FIR filter component may be coupled to a first input signal, the gates of the third and fourth transistor of the main cursor FIR filter component may be coupled to a second input signal, and the main cursor FIR filter component may be configured to generate a first output signal at the first output node and a second output signal at the second output node, and the gates of the first and second transistor of the post cursor FIR filter component may be coupled to a first time-delayed input signal, the gates of the third and fourth transistor of the post cursor FIR filter component may be coupled to a second time-delayed input signal, and the post cursor FIR filter component may be configured to generate a first time-delayed output signal at the first output node and a second time-delayed output signal at the second output node.

In one or more embodiments, the two or more FIR filter components may include a first FIR filter component, a second FIR filter component, and a third FIR filter component, wherein the gates of the first and second transistor of the first FIR filter component may be coupled to a most significant big (MSB) of a first input signal, the gates of the third and fourth transistor of the first FIR filter component may be coupled to an MSB of a second input signal, and the first FIR filter component may be configured to generate a first output signal at the first output node and a second output signal at the second output node, the gates of the first and second transistor of the second FIR filter component may be coupled to the MSB of the first input signal, the gates of the third and fourth transistor of the second FIR filter component may be coupled to the MSB of the second input signal, and the second FIR filter component may be configured to generate a first output signal at the first output node and a second output signal at the second output node, and the gates of the first and second transistor of the third FIR filter component may be coupled to a least significant bit (LSB) of the first input signal, the gates of the third and fourth transistor of the third FIR filter component may be coupled to an LSB of the second signal, and the third FIR filter component may be configured to generate a first output signal at the first output node and a second output signal at the second output node.

Other and further aspects and features will be evident from reading the following detailed description of the embodiments.

BRIEF DESCRIPTION OF THE DRAWINGS

The drawings illustrate the design and utility of embodiments, in which similar elements are referred to by common reference numerals. These drawings are not necessarily drawn to scale. In order to better appreciate how the above-recited and other advantages and objects are obtained, a more particular description of the embodiments will be rendered, which are illustrated in the accompanying drawings. These drawings depict only typical embodiments and are not therefore to be considered limiting of the scope of the claims.

DETAILED DESCRIPTION

Various embodiments are described hereinafter with reference to the figures. It should be noted that the figures are not drawn to scale and that the elements of similar structures or functions are represented by like reference numerals throughout the figures. It should be noted that the figures are only intended to facilitate the description of the embodiments. They are not intended as an exhaustive description of the invention or as a limitation on the scope of the claimed invention. In addition, an illustrated embodiment need not have all the aspects or advantages shown. An aspect or an advantage described in conjunction with a particular embodiment is not necessarily limited to that embodiment and can be practiced in any other embodiments even if not so illustrated. Also, reference throughout this specification to "some embodiments" or "other embodiments" means that a particular feature, structure, material, or characteristic described in connection with the embodiments is included in at least one embodiment. Thus, the appearances of the phrase "in some embodiments" or "in other embodiments" in various places throughout this specification are not necessarily referring to the same embodiment or embodiments.

Figure 1:
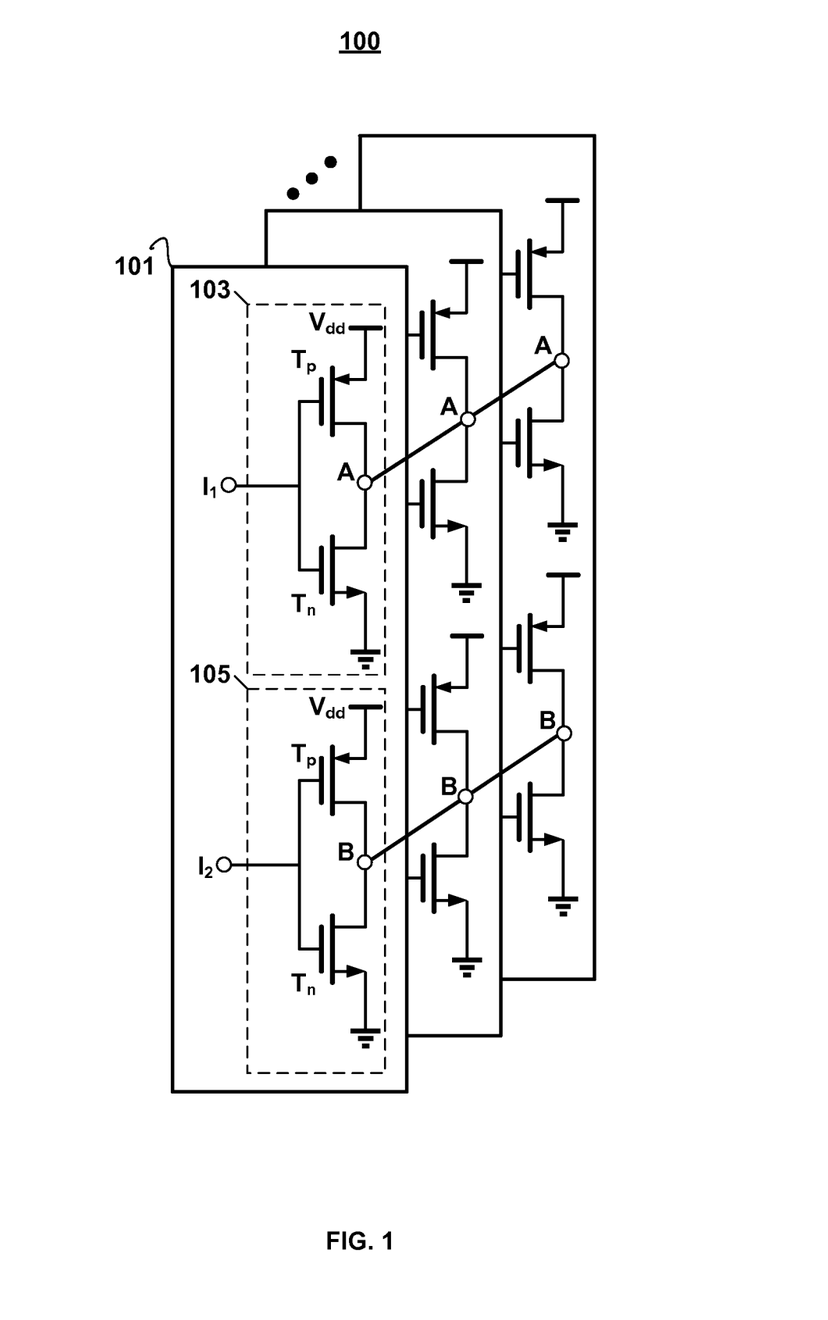
FIG. 1 illustrates a circuit diagram of a FIR filter component implemented in a voltage mode driver.

FIG. 1 illustrates a circuit diagram of a FIR filter component 100 implemented in a voltage mode driver. The finite impulse response filter component 100 comprises a plurality of segments 101. Each segment includes a first switching component 103 and a second switching component 105.

The first switching component 103 of each segment 101 includes a PMOS transistor $T_p$ and an NMOS transistor $T_n$. The gate of the PMOS transistor $T_p$ is coupled to a first input signal $I_1$, the source of the PMOS transistor $T_p$ is coupled to a first potential (e.g., $V_{dd}$) and the drain of the PMOS transistor $T_p$ is coupled to a first output node A. The gate of the NMOS transistor $T_n$ is also coupled to the first input signal $I_1$, the source of NMOS transistor $T_n$ is coupled to a second potential (e.g., ground), and the drain of the NMOS transistor $T_n$ is coupled to the first output node A.

The second switching component 105 of each segment 101 also includes a PMOS transistor $T_p$ and an NMOS transistor $T_n$. The gate of the PMOS transistor $T_p$ is coupled to a second input signal $I_2$, the source of the PMOS transistor $T_p$ is coupled to the first potential (e.g., Vdd) and the drain of the PMOS transistor $T_p$ is coupled to a second output node B. The gate of the NMOS transistor $T_n$ is also coupled to the second input signal $I_2$, the source of NMOS transistor $T_n$ is coupled to the second potential (e.g., ground), and the drain of the NMOS transistor $T_n$ is coupled to the second output node B.

The first input signal $I_1$ and second input signal $I_2$ are each one of a pair of differential signals. The first input signal his fed to the gate of the PMOS transistor $T_p$ and NMOS transistor $T_n$ of each first switching component 103 of each segment 101. Likewise, the second input signal $I_2$ is fed to the gate of the PMOS transistor $T_p$ and NMOS transistor $T_p$ of each second switching component 105 of each segment 101. For each segment 101, the first switching component 103 provides frequency dependent voltage adjustment to the first input signal $I_1$ to generate a first segment output signal at the first output node A and the second switching component 105 provides frequency dependent voltage to the second input signal $I_2$ to generate a second segment output signal at the second output node B. Each segment 101 shares the same first output node A and second output node B. As such, the first segment output signals of each segment 101 are combined to form the first output signal and the second segment output signals of each segment 101 are combined to form the second output signal.

The frequency dependent voltage adjustment provided by the FIR filter component 100 is determined by FIR coefficients. In this approach, the FIR coefficients are determined by the number of segments 101 used to implement the FIR filter component 100. In other words, each segment 101 may have a particular configuration and a combination of the different segment configurations determines the frequency dependent voltage adjustment of the first and second input signals. However, in order for this approach to provide high resolution frequency dependent voltage adjustment, a large amount of segmenting is required. As mentioned above, due to the minimum device limit, a large amount of segmenting will result in an increased amount of power consumed by the voltage mode driver thereby eliminating the power consumption advantages typically attributed to voltage mode drivers.

Figure 2:
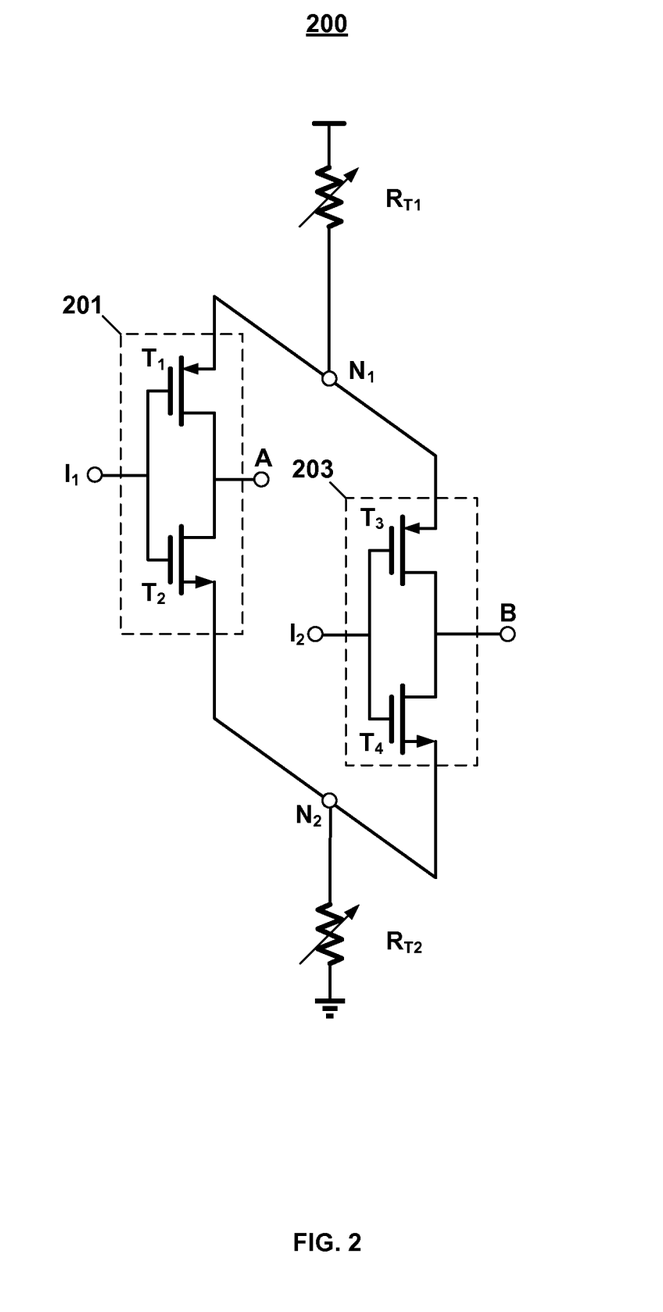
FIG. 2 illustrates a circuit diagram of a FIR filter component implemented in a voltage mode driver according to some embodiments.

FIG. 2 illustrates a circuit diagram of a FIR filter component 200 implemented in a voltage mode driver according to some embodiments. The FIR filter component 200 includes a first switching component 201, a second switching component 203, a first tunable resistor $R_{T1}$, and a second tunable resistor $R_{T2}$.

The first switching component 201 includes a first transistor $T_1$ with a first drain/source, a gate, and a second drain/source and a second transistor $T_2$ with a first drain/source, a gate, and a second drain/source. The first drain/source of the first transistor $T_1$ is coupled to a first node $N_1$, the gate of the first transistor $T_1$ is coupled to a first input signal $I_1$, and the second drain/source of the first transistor $T_1$ is coupled to a first output node A. The first drain/source of the second transistor $T_2$ is coupled to the first output node A, the gate of the second transistor $T_2$ is coupled to the first input signal $I_1$, and the second drain/source of the second transistor $T_2$ is coupled to a second node $N_2$. The first input signal $I_1$ is one of a pair of differential input signals.

The first transistor $T_1$ and the second transistor $T_2$ of the first switching component 201 are a complementary pair of transistors. In other words, if the first transistor $T_1$ is in a substantially conductive state ("ON"), then the second transistor $T_2$ is in a substantially nonconductive state ("OFF"), and vice versa. Thus, if the first input signal $I_1$ received at the gates of the first transistor $T_1$ and the second transistor $T_2$ causes the first transistor $T_1$ to be in an ON state, then the first input signal $I_1$ will also cause the second transistor $T_2$ to be in an OFF state. Likewise, if the first input signal $I_1$ received at the gates of the first transistor $T_1$ and the second transistor $T_2$ causes the first transistor $T_1$ to be in an OFF state, then the first input signal $I_1$ will also cause the second transistor $T_2$ to be in an ON state.

The second switching component 203 includes a third transistor $T_3$ with a first drain/source, a gate, and a second drain/source and a fourth transistor $T_4$ with a first drain/source, a gate, and a second drain/source. The first drain/source of the third transistor $T_3$ is coupled to the first node $N_1$, the gate of the third transistor $T_3$ is coupled to a second input signal $I_2$, and the second drain/source of the third transistor $T_3$ is coupled to a second output node B. The first drain/source of the fourth transistor $T_4$ is coupled to the second output node B, the gate of the fourth transistor $T_4$ is coupled to the second input signal $I_2$, and the second drain/source of the fourth transistor $T_4$ is coupled to the second node $N_2$. The second input signal $I_2$ is also one of a pair of differential input signals.

The third transistor $T_3$ and the fourth transistor $T_4$ of the second switching component are also a complementary pair of transistors. If the third transistor $T_3$ is in a substantially conductive state ("ON"), then the fourth transistor $T_4$ is in a substantially nonconductive state ("OFF"), and vice versa. Thus, if the second input signal $I_2$ received at the gates of the third transistor $T_3$ and the fourth transistor $T_4$ causes the third transistor $T_3$ to be in an ON state, then the second input signal $I_2$ will also cause the fourth transistor $T_4$ to be in an OFF state. Likewise, if the second input signal $I_2$ received at the gates of the third transistor $T_3$ and the fourth transistor $T_4$ causes the third transistor $T_3$ to be in an OFF state, then the second input signal $I_2$ will also cause the fourth transistor $T_4$ to be in an ON state.

The first switching component 201 and the second switching component 203 are also complementary components. If the first switching component 201 is configured such that the first transistor $T_1$ is in an ON state and the second transistor $T_2$ is in an OFF state, then the second switching component 203 will be configured such that the third transistor $T_3$ is in an OFF state and the fourth transistor $T_4$ is in an ON state. Likewise, if the first switching component 201 is configured such that the first transistor $T_1$ is in an OFF state and the second transistor $T_2$ is in an ON state, then the second switching component 203 will be configured such that the third transistor $T_3$ is in an ON state and the fourth transistor $T_4$ is in an OFF state. This is because the first input signal $I_1$ and the second input signal $I_2$ are each one of a pair of differential signals.

In this exemplary embodiment, the first transistor $T_1$ and third transistor $T_3$ are PMOS transistors and thus first drains/sources thereof are sources and second drains/sources thereof are drains. Likewise, the second transistor $T_2$ and the fourth transistor $T_4$ are NMOS transistors and thus first drains/sources thereof are drains and second drains/sources thereof are sources. However, one ordinarily skilled in the art will recognize that various combinations of PMOS and NMOS transistors may be implemented for the first, second, third, and fourth transistors.

The first tunable resistor $R_{T1}$ is coupled between a first potential and the first node $N_1$. In some embodiments, the first potential may be a supply voltage $V_{dd}$. The second tunable resistor $R_{T2}$ is coupled between the second node $N_2$ and a second potential. In some embodiments, the second potential may be ground. In some embodiments the first tunable resistor $R_{T1}$ and second tunable resistor $R_{T2}$ may have the same tunable range of resistance values. In other embodiments, the first tunable resistor $R_{T1}$ and second tunable resistor $R_{T2}$ may have different tunable ranges of resistance values.

As mentioned above, the frequency dependent voltage adjustment provided by the FIR filter component 200 is determined by FIR coefficients. In the FIR filter component 200 of FIG. 2, the FIR coefficients may be determined by the relative strength of the FIR filter 200, which is defined as $1/(R_{tune} R_{switch})$ wherein $R_{tune}$ is the resistance of the first and second tunable resistor $R_{T1}$, $R_{T2}$ and $R_{switch}$ is the impedance of a transistor $T_1$, $T_2$, $T_3$, $T_4$. This is in contrast to the approach described in FIG. 1, wherein the FIR coefficients are determined by the number of segments. By adjusting the resistance value of the tunable resistors $R_{T1}$, $R_{T2}$, the relative strength of the FIR filter component 200 may also be adjusted and desirable FIR coefficients may be obtained.

When a first input signal $h$ is received by the gates of the first transistor $T_1$ and second transistor $T_2$ of the first switching component 201, either the first transistor $T_1$ or second transistor $T_2$ is switched to an ON state. If the first transistor $T_1$ is in an ON state, then the first tunable resistor $R_{T1}$ may be adjusted to control how much the first input signal $I_1$ is pulled up to generate a first output signal at the first output node A. Likewise, if the first transistor $T_1$ is in an OFF state, then the second tunable resistor $R_{T2}$ may be adjusted to control how much the first input signal $I_1$ is pulled down to generate a first output signal at the first output node A.

When a second input signal $I_2$ is received by the gates of the third transistor $T_3$ and fourth transistor $T_4$ of the second switching component 203, either the third transistor $T_3$ or fourth transistor $T_4$ is switched to an ON state. If the third transistor $T_3$ is in an ON state, then the first tunable resistor $R_{T1}$ may be adjusted to control how much the second input signal $I_2$ is pulled up to generate a second output signal at the second output node B. Likewise, if the third transistor $T_3$ is in an OFF state, then the second tunable resistor $R_{T2}$ may be adjusted to control how much the second input signal $I_2$ is pulled down to generate a second output signal at the second output node B.

Thus, the frequency dependent voltage adjustment provided to input signals in order to generate desired output signals may be accomplished using tunable resistors rather than partitioning the FIR filter component into several segments, thereby allowing the FIR filter component to retain the power consumption advantages typically attributed to voltage mode drivers. However, it should be noted that the FIR filter component may be extended to include segmenting in addition to implementing tunable resistors. One of ordinary skill in the art will recognize that certain situations may benefit from having frequency dependent voltage adjustment provided by way of both tunable resistors as well as segmenting.

In some situations, it may be advantageous to provide FIR filtering to different time-shifted versions of the input signal to generate a desired output signal. For example, it may be desirable for a voltage mode driver to provide both pre-processing and post-processing for a given differential input signal pair to compensate for channel losses experienced by the input signal.

Figure 3:
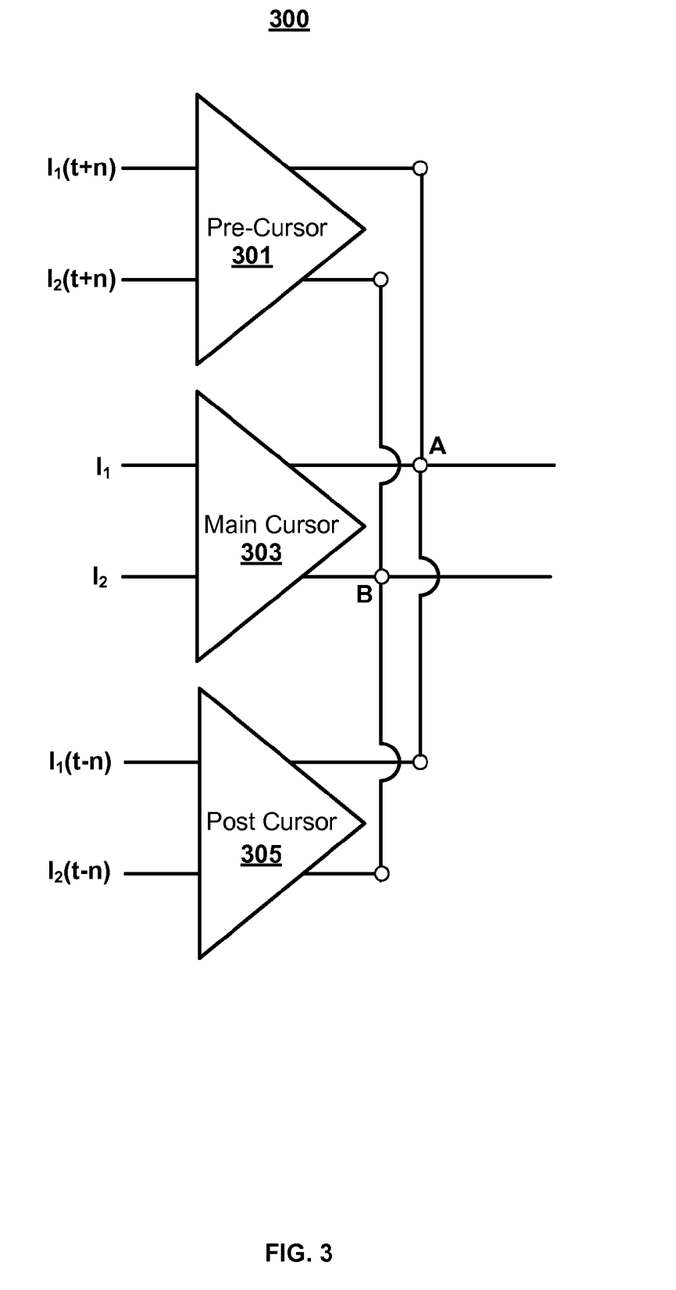
FIG. 3 illustrates a block diagram of a FIR filter arrangement implemented in a voltage mode driver according to some embodiments.

FIG. 3 illustrates a block diagram of an alternative FIR filter arrangement implemented in a voltage mode driver according to some embodiments. FIG. 3 illustrates an FIR filter arrangement 300 that supports both pre-processing and post-processing. The finite impulse response arrangement 300 depicted in FIG. 3 includes a first FIR filter component 301 (referred to herein as a pre-cursor), a second FIR filter component 303 (referred to herein as a main cursor), and a third FIR filter component 305 (referred to herein as a post cursor). Each of the pre-cursor 301, main cursor 303, and post cursor 305 is substantially the same as the FIR filter component 200 described above in FIG. 2, and as such only new features of these FIR filter components 301, 303, 305 will be discussed. For purposes of illustration, the pre-cursor 301, main cursor 303, and post-cursor 305 will each be depicted as a component (in block diagram form) configured to receive a respective first and second input signal and generate a respective first and second output signal. However, it should be noted that each FIR filter component (e.g., pre-cursor, main cursor, post-cursor) comprises the components discussed above in FIG. 2.

The pre-cursor 301 includes a first switching component with a first transistor and second transistor, a second switching component with a third transistor and a fourth transistor, a first tunable resistor and second tunable resistor configured in the same arrangement as described above in FIG. 2. However, rather than receiving the first input signal at the gates of the first and second transistor of the first switching component, the pre-cursor 301 receives a time-advanced version of the first input signal $I_1(t+n)$. Likewise, rather than receiving the second input signal at the gates of the third transistor and fourth transistor of the second switching component, the pre-cursor 301 receives a time-advanced version of the second input signal $I_2(t+n)$. The first time-advanced input signal $I_1(t+n)$ and the second time-advanced input signal $I_2(t+n)$ are each a time-advanced signal of a differential signal pair. The term $t+n$ refers to an n-bit time advanced input signal.

The pre-cursor 301 generates a first time-advanced output signal at the first output node A and a second time-advanced output signal at the second output node B in the same manner that the first output signal and second output signal were generated above in FIG. 2.

The main cursor 303 also includes a first switching component with a first transistor and second transistor, a second switching component with a third transistor and a fourth transistor, a first tunable resistor and second tunable resistor configured in the same arrangement as described above in FIG. 2. The main cursor 303 receives the first input signal $I_1$ at the gates of the first and second transistor of the first switching component and the second input signal $I_2$ at the gates of the third transistor and fourth transistor of the second switching component. The first input signal $I_1$ and second input signal $I_2$ received by the main cursor 303 are not time-shifted. The main cursor 303 then generates a first output signal at the first output node A and a second output signal at the second output node B in the same manner that the first output signal and second output signal were generated above in FIG. 2.

The post-cursor 305 includes a first switching component with a first transistor and second transistor, a second switching component with a third transistor and a fourth transistor, a first tunable resistor and second tunable resistor configured in the same arrangement as described above in FIG. 2. However, rather than receiving the first input signal at the gates of the first and second transistor of the first switching component, the post-cursor 305 receives a time-delayed version of the first input signal $I_1(t-n)$. Likewise, rather than receiving the second input signal at the gates of the third transistor and fourth transistor of the second switching component, the post-cursor receives a time-delayed version of the second input signal $I_2(t-n)$. The first time-delayed input signal $I_1(t-n)$ and the second time-delayed input signal $I_2(t-n)$ are each a time-delayed signal of a differential signal pair. The term t−n refers to an n-bit time delayed input signal.

The post-cursor 305 generates a first time-delayed output signal at the first output node A and a second time-delayed output signal at the second output node B in the same manner that the first output signal and second output signal were generated above in FIG. 2.

The pre-cursor 301, main cursor 303, and post-cursor 305 share the same first output node A and second output node B. As such, the first time-advanced output signal generated by the pre-cursor 301, the first output signal generated by the main cursor 303, and the first time-delayed output signal generated by the post-cursor 305 are combined at the first output node A. Likewise, the second time-shifted output signal generated by the pre-cursor 301, the second output signal generated by the main cursor 303, and the second time-delayed output signal generated by the post-cursor 305 are combined at the second output node B.

In this way the FIR filter arrangement 300 of FIG. 3 may provide both pre-processing and post-processing for a given differential input signal pair to compensate for channel losses experienced by the differential input signal pair.

While the FIR filter arrangement 300 of FIG. 3 illustrates a combination of a pre-cursor 301, main cursor 303, and a post-cursor 305, it should be noted that various different FIR filter arrangements are also possible. Thus, any number of pre-cursors and any number of post-cursors may be combined with the main cursor to provide FIR filtering to time-shifted versions of the input signal to generate a desired output signal.

The FIR filter component of FIG. 2 and the FIR filter arrangement of FIG. 3 are both configured to support FIR filtering for a 2-tap signal. However, the FIR filter component of FIG. 2 and the FIR filter arrangement of FIG. 3 may both be extended to support FIR filtering for an n-tap signal.

Figure 4:
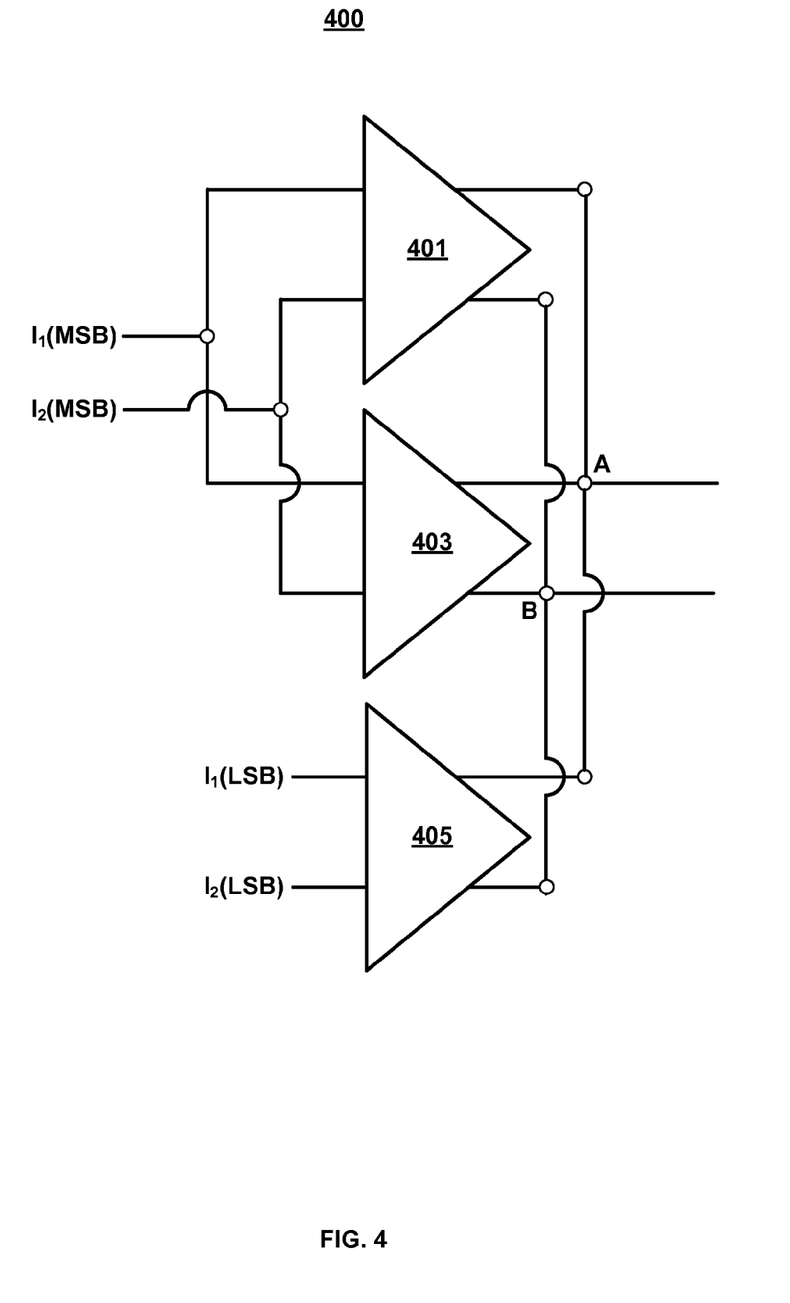
FIG. 4 illustrates a block diagram of an alternative finite impulse response (FIR) filter arrangement implemented in a voltage mode driver according to some embodiments.

FIG. 4 illustrates a block diagram of an FIR filter arrangement implemented in a voltage mode driver in accordance with some embodiments. FIG. 4 illustrates an FIR filter arrangement 400 implemented in a pulse-amplitude modulation (PAM) 4 voltage mode driver. PAM-4 refers to a two-bit modulator that will map an input signal to four possible levels. Thus, each one of a differential input signal pair comprises 2-bits.

The FIR filter arrangement 400 in FIG. 4 comprises a first FIR filter component 401, a second FIR filter component 403, and a third FIR filter component 405. Each FIR filter component is substantially the same as the FIR filter component 200 described above in FIG. 2, and as such only new and/or relevant features of these FIR filter components 401, 403, 405 will be discussed. For purposes of illustration, the first FIR filter component 401, second FIR filter component 403, and third FIR filter component 405 will each be depicted as a component (in block diagram form) configured to receive a respective first and second input signal and generate a respective first and second output signal. However, it should be noted that each FIR filter component 401, 403, 405 comprises the components discussed above in FIG. 2.

The first FIR filter component 401 and second FIR filter component 403 may each be configured to receive a most significant bit (MSB) of the first input signal $I_1$(MSB) and a MSB of the second input signal $I_2$(MSB). The gates of the first and second transistors of the first switching component of the first FIR filter component 401 are configured to receive a MSB of the first input signal $I_1$(MSB). The gates of the first and second transistors of the first switching component of the second FIR filter component 403 are also configured to receive a MSB of the first input signal $I_1$(MSB). The gates of the third and fourth transistors of the second switching component of the first FIR filter component 401 are configured to receive a MSB of the second input signal $I_2$(MSB). The gates of the third and fourth transistors of the second switching component of the second FIR filter component 403 are also configured to receive a MSB of the second input signal $I_2$(MSB).

The first and second tunable resistors of the first FIR filter component 401 may be adjusted to generate a desired first and second output signal for the first FIR filter component 401 at the first output node A and second output node B respectively in the same manner as discussed above. Similarly, the first and second tunable resistors of the second FIR filter component 403 may also be adjusted to generate a desired first and second output signal for the second FIR filter component 403 at the first output node A and second output node B respectively in the same manner as discussed above.

The third FIR filter component 405 may be configured to receive a least significant bit (LSB) of the first input signal $I_1$(LSB) and a LSB of the second input signal $I_2$(LSB). The gates of the first and second transistors of the first switching component of the third FIR filter component 405 are configured to receive a LSB of the first input signal $I_1$(LSB). The gates of the third and fourth transistors of the second switching component of the third FIR filter component 405 are configured to receive a LSB of the second input signal $I_2$(LSB).

The first and second tunable resistors of the third FIR filter component 405 may be adjusted to generate a desired first and second output signal for the third FIR filter component 405 at the first output node A and the second output node B respectively in the same manner as discussed above.

The first FIR filter component 401, second FIR filter component 403, and third FIR filter component 405 share the same first output node A and second output node B. The first output signal of the first FIR filter component 401, the first output signal of the second FIR filter component 403 and the first output signal of the third FIR filter component 405 may be combined to form a single first FIR output signal. Similarly, the second output signal of the first FIR filter component 401, the second output signal of the second FIR filter component 403, and the second output signal of the third FIR filter component 403 may similarly be combined to form a single second FIR output signal.

Because four different MSB/LSB input signal combinations (e.g., MSB and LSB=1; MSB and LSB=0; MSB=1 and LSB=0; or MSB=0 and LSB=1) may be received when operating a PAM 4 voltage mode driver, four different output signal levels for each output signal (i.e., first output signal and second output signal) may be generated using the FIR filter arrangement of FIG. 4. When the first and second FIR filter component s 401, 403 receive a MSB first input signal and a MSB second input signal of 1, and the third FIR filter component 405 receives a LSB first input signal and a LSB second input signal of 1, a particular first FIR output signal and a particular second FIR output signal is generated. Likewise, when the first and second FIR filter components 401, 403 receive a MSB first input signal and a MSB second input signal of 0, and the third filter component receives a LSB first input signal and a LSB second input signal of 0, a different first FIR output signal and a different second FIR output signal is generated. This also holds true for the other two MSB/LSB combinations (i.e., MSB=1 and LSB=0 or MSB=0 and LSB=1).

Thus, the filter arrangement 400 described in FIG. 4 can support a PAM-4 voltage driver. While the above description has been described for a PAM-4 voltage driver ordinarily skill in the art will recognize that the partitioning of an FIR filter arrangement into several FIR filter segments may be extended to support any n-tap signal.

In some situations, it may be advantageous to provide n-tap signal FIR filtering to different time-shifted versions of the n-tap input signal to generate a desired output signal. For example, it may be desirable for a voltage mode driver to provide both pre-processing and post-processing for a given differential n-tap input signal pair to compensate for channel losses experienced by the n-tap input signal.

Thus, the FIR filter arrangement of FIG. 4 may be extended to support pre-processing and post-processing for a given differential n-tap input signal in the same manner that the FIR filter arrangement of FIG. 3 is an extension of the FIR filter component in FIG. 2 to support pre-processing and post-processing for a 1-tap input signal.

Figure 5:
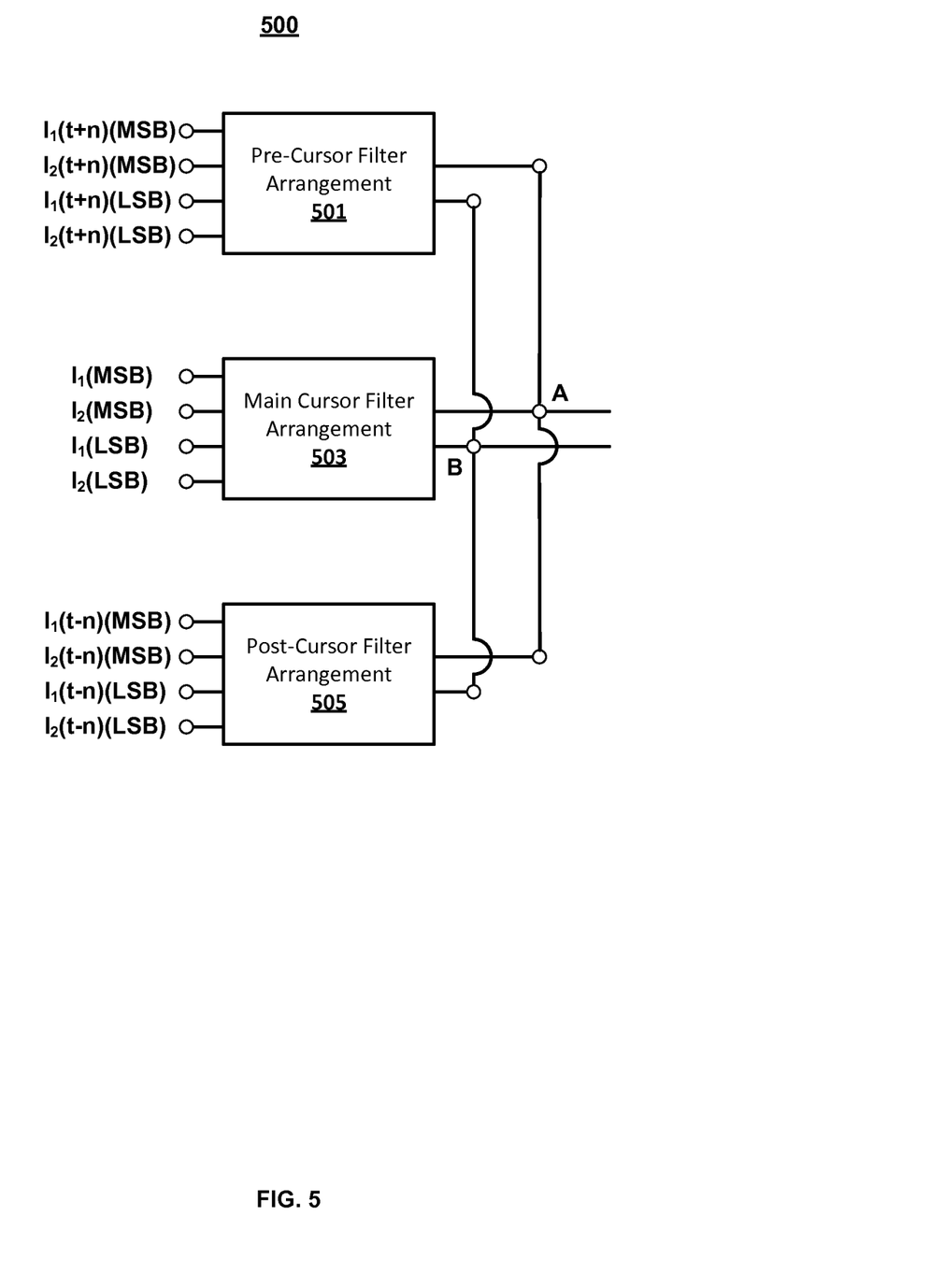
FIG. 5 illustrates a block diagram of an alternative FIR filter arrangement implemented in a voltage mode driver according to some embodiments.

FIG. 5 illustrates a block diagram of an alternative FIR filter arrangement implemented in a voltage mode driver in accordance with some embodiments. FIG. 5 illustrates an FIR filter arrangement that supports both pre-processing and post-processing for a PAM-4 voltage mode driver. The FIR filter arrangement 500 in FIG. 5 includes a pre-cursor filter arrangement 501, a main cursor filter arrangement 503, and a post cursor filter arrangement 505. The pre-cursor filter arrangement 501, main cursor filter arrangement 503, and post cursor filter arrangement 505 are each substantially the same as the FIR filter arrangement 400 described above in FIG. 4, and as such only new and/or relevant features of these FIR filter arrangements 501, 503, 505 will be discussed. For purposes of illustration, the pre-cursor FIR filter arrangement 501, main cursor FIR filter arrangement 503, and post-cursor FIR filter arrangement 505 will each be depicted as a component (in block diagram form) configured to receive a respective most significant bit (MSB) of a first input signal $I_1$(MSB), most significant bit (MSB) of a second input signal $I_2$(MSB), least significant bit (LSB) of the first input signal $I_1$(LSB), and least significant bit (LSB) of the second input signal $I_2$(LSB) and generate a respective first and second FIR output signal. However, it should be noted that each FIR filter arrangement (i.e., pre-cursor, main cursor, post-cursor) comprises the components discussed above in FIG. 4.

The first FIR filter component and second FIR filter component of the pre-cursor filter arrangement 501 each receive a MSB of a time-advanced first input signal $I_1$(t+n)(MSB) and a time-advanced second input signal $I_2$(t+n)(MSB). The third filter component of the pre-cursor filter arrangement 500 receives a LSB of the time-advanced first input signal $I_1$(t+n)(LSB) and the time-advanced second input signal $I_2$(t+n)(MSB). The first filter component, second filter component, and third filter component each generate a time-advanced first output signal and a time-advanced second output signal in the same manner as discussed above. The first filter component and second filter component each generate a time-advanced first output signal and a time-advanced second output signal corresponding to the MSB of the first and second time-advanced input signals. The third filter component generates a time-advanced first output signal and a time-advanced second output signal corresponding to the LSB of the first and second time-advanced input signals. The time-advanced first output signals of each FIR filter component of the pre-cursor filter arrangement 501 are combined to form a first pre-cursor FIR output signal at output node A and the time-advanced second output signals of each FIR filter component of the pre-cursor filter arrangement 501 are combined to form a second pre-cursor FIR output signal at output node B.

The first filter component and second filter component of the main cursor filter arrangement 503 each receive a MSB of a first input signal $I_1$(MSB) and a second input signal $I_2$(MSB). The third filter component of the main cursor filter arrangement 503 receives a LSB of the first input signal $I_1$(LSB) and the second input signal $I_2$(LSB). The first filter component, second filter component, and third filter component each generate a first output signal and a second output signal in the same manner as discussed above. The first filter component and second filter component each generate a first output signal and a second output signal corresponding to the MSB of the first and second input signals. The third filter component generates a first output signal and a second output signal corresponding to the LSB of the first $I_1$(LSB) and second input signals $I_2$(LSB). The first output signals of each FIR filter component of the main cursor filter arrangement 503 are combined to form a first main cursor FIR output signal at output node A and the second output signals of each FIR filter component of the main cursor filter arrangement 503 are combined to form a second main cursor FIR output signal at output node B.

The first filter component and second filter component of the post cursor filter arrangement 505 receive a MSB of a time-delayed first input signal $I_1$(t−n)(MSB) and a time-delayed second input signal $I_2$(t−n)(MSB). The third filter component of the post cursor filter arrangement 505 receives a LSB of the time-delayed first input signal $I_1$(t−n)(LSB) and the time-delayed second input signal $I_2$(t−n)(LSB). The first filter component, second filter component, and third filter component each generate a time-delayed first output signal and a time-delayed second output signal in the same manner as discussed above. The first filter component and second filter component each generate a first time-delayed output signal and a second time-delayed output signal corresponding to the MSB of the first and second input signals. The third filter component generates a first time-delayed output signal and a second time-delayed output signal corresponding to the LSB of the first $I_1$(t−n)LSB) and second time-delayed input signals $I_2$(t−n)LSB). The time-delayed first output signals of each FIR filter component of the post-cursor filter arrangement 505 are combined to form a first post cursor FIR output signal at output node A and the time-delayed second output signals of each FIR filter component of the post-cursor filter arrangement 505 are combined to form a second post cursor FIR output signal at output node B.

The pre-cursor FIR filter arrangement 501, main cursor FIR filter arrangement 503, and post-cursor FIR filter arrangement 505 share the same first output node A and second output node B. The first pre-cursor FIR output signal, first main cursor FIR output signal, and first post-cursor FIR output signal may be combined to form a first FIR output signal at output node A. Likewise, the second pre-cursor FIR output signal, second main cursor FIR output signal, and second post-cursor FIR output signal may be combined to form a second FIR output signal at output node B.

Thus, the FIR filter arrangement 500 described in FIG. 5 can support pre-processing for a PAM-4 voltage driver. While the above description has been described for a PAM-4 voltage driver ordinarily skill in the art will recognize that the partitioning of an FIR filter arrangement into several FIR filter component segments may be extended to support any n-tap signal. Similarly, while the FIR filter arrangement of FIG. 5 illustrates a combination of a single pre-cursor filter arrangement, a single main cursor filter arrangement, and a single post-cursor filter arrangement, it should be noted that any number of pre-cursor filter arrangements and any number of post-cursor filter arrangements may be combined with the main cursor filter arrangement to provide FIR filtering to time-shifted versions of an n-tap input signal to generate a desired n-tap output signal.

While the embodiments described above have involved FIR filter components and FIR filter arrangements that support differential input signals, one ordinarily skilled in the art will recognize that each FIR filter described above may be modified to support only a single input signal, by utilizing only a single switching component rather than two switching components. Additionally, FIR filter components described above may be modified such that the first switching component is coupled to the second input signal and the second switching component is coupled to the first input signal. Furthermore, any FIR filter arrangements may be fine-tuned using the tunable resistors in order to provide impedance matching between the FIR filter arrangement and other circuit components.

Although particular embodiments have been shown and described, it will be understood that they are not intended to limit the claimed invention, and it will be made obvious to those skilled in the art that various changes and modifications may be made without departing from the spirit and scope of the claimed invention. The specification and drawings are, accordingly, to be regarded in an illustrative rather than restrictive sense. The claimed invention is intended to cover alternatives, modifications, and equivalents.

What is claimed is:

1. A FIR filter component for a voltage mode driver, comprising:
    a first node;
    a second node;
    a first switching component, comprising:
        a first transistor having a first drain/source, a gate, and a second drain/source;
        a second transistor having a first drain/source, a gate, and a second drain/source;
        wherein the first drain/source of the first transistor is coupled to the first node; the second drain/source of the first transistor is coupled to a first output node; the first drain/source of the second transistor is coupled to the first output node; the second drain/source of the second transistor is coupled to the second node; and the gates of the first and second transistor are coupled to a first input signal;
    a first tunable resistor coupled between the first node and a first potential; and
    a second tunable resistor coupled between the second node and a second potential;
    wherein the FIR filter component is configured to generate a first output signal at the first output node; and
    wherein the FIR filter component further comprises a second switching component coupled to a second input signal, the first input signal and second input signal being a pair of differential input signals.

2. The FIR filter component of claim 1, wherein the first potential is a supply voltage.

3. The FIR filter component of claim 1, wherein the second potential is ground.

4. The FIR filter component of claim 1, wherein resistance values associated with the first tunable resistor and resistance values associated with the second tunable resistor are the same.

5. The FIR filter component of claim 1, wherein resistance values associated with the first tunable resistor and resistance values associated with the second tunable resistor are different.

6. The FIR filter component of claim 1, wherein the second switching component comprises:
    a third transistor having a first drain/source, a gate, and a second drain/source; and
    a fourth transistor having a first drain/source, a gate, and a second drain/source;
    wherein the first drain/source of the third transistor is coupled to the first node; the second drain/source of the third transistor is coupled to a second output node; the first drain/source of the fourth transistor is coupled to the second output node; the second drain/source of the fourth transistor is coupled to the second node; and the gates of the third and fourth transistor are coupled to the second input signal; and
    wherein the FIR filter component is further configured to generate a second output signal at the second output node.

7. The FIR filter component of claim 6, wherein the first transistor and third transistor are PMOS transistors, and wherein the second transistor and fourth transistor are NMOS transistors.

8. A FIR filter arrangement for a voltage mode driver, comprising:
    two or more FIR filter components, wherein each of the two or more FIR filter components comprises:
        a first node;
        a second node;
        a first switching component, comprising:
            a first transistor having a first drain/source, a gate, and a second drain/source;
            a second transistor having a first drain/source, a gate, and a second drain/source;
            wherein the first drain/source of the first transistor is coupled to the first node; the second drain/source of the first transistor is coupled to a first output node; the first drain/source of the second transistor is coupled to the first output node; the second drain/source of the second transistor is coupled to the second node; and the gates of the first and second transistor are coupled to a first input signal;
        a first tunable resistor coupled between the first node and a first potential; and
        a second tunable resistor coupled between the second node and a second potential;
        wherein the first switching component is configured to generate a first output signal at the first output node; and
    wherein the first output nodes of each of the two or more FIR filter components are shared such that the first output signals generated by each of the two or more FIR filter components are combined; and
    wherein each of the two or more FIR filter components further comprises a second switching component coupled to a second input signal, the first input signal and second input signal of each of the two or more FIR filter components being a pair of differential input signals.

9. The FIR filter arrangement of claim 8, wherein the first potential of each of the two or more FIR filter components is a supply voltage.

10. The FIR filter arrangement of claim 8, wherein the second potential of each of the two or more FIR filter components is ground.

11. The FIR filter arrangement of claim 8, wherein resistance values associated with the first tunable resistor and resistance values associated with the second tunable resistor are the same for each of the two or more FIR filter components.

12. The FIR filter arrangement of claim 8, wherein the second switching component comprises:
   a third transistor having a first drain/source, a gate, and a second drain/source; and
   a fourth transistor having a first drain/source, a gate, and a second drain/source;
   wherein the first drain/source of the third transistor is coupled to the first node;
   the second drain/source of the third transistor is coupled to a second output node; the first drain/source of the fourth transistor is coupled to the second output node; the second drain/source of the fourth transistor is coupled to the second node; the gates of the third and fourth transistor are coupled to the second input signal;
   wherein the second switching component is configured to generate a second output signal at the second output node.

13. The FIR filter arrangement of claim 12, wherein the first transistor and third transistor of each of the two or more FIR filter components are PMOS transistors, and wherein the second transistor and fourth transistor of each of the two or more FIR filter components are NMOS transistors.

14. The FIR filter arrangement of claim 12, wherein the second output nodes of each of the two or more FIR filter components are shared such that the second output signals generated by each of the two or more FIR filter components are combined.

15. The FIR filter arrangement of claim 12, wherein the two or more FIR filter components comprise three FIR filter components.

16. The FIR filter arrangement of claim 15, wherein the three FIR filter components comprise a pre-cursor FIR filter component, a main cursor FIR filter component, and a post cursor FIR filter component.

17. The FIR filter arrangement of claim 16, wherein:
   the gates of the first and second transistor of the pre-cursor FIR filter component are coupled to a first time-advanced input signal, the gates of the third and fourth transistor of the pre-cursor FIR filter component are coupled to a second time-advanced input signal, and the pre-cursor FIR filter component is configured to generate a first time-advanced output signal at the first output node and a second time-advanced output signal at the second output node;
   the gates of the first and second transistor of the main cursor FIR filter component are coupled to a first input signal, the gates of the third and fourth transistor of the main cursor FIR filter component are coupled to a second input signal, and the main cursor FIR filter component is configured to generate a first output signal at the first output node and a second output signal at the second output node; and
   the gates of the first and second transistor of the post cursor FIR filter component are coupled to a first time-delayed input signal, the gates of the third and fourth transistor of the post cursor FIR filter component are coupled to a second time-delayed input signal, and the post cursor FIR filter component is configured to generate a first time-delayed output signal at the first output node and a second time-delayed output signal at the second output node.

18. The FIR filter arrangement of claim 12, wherein the two or more FIR filter components include a first FIR filter component, a second FIR filter component, and a third FIR filter component, and wherein:
   the gates of the first and second transistor of the first FIR filter component are coupled to a most significant big (MSB) of a first input signal, the gates of the third and fourth transistor of the first FIR filter component are coupled to an MSB of a second input signal, and the first FIR filter component is configured to generate a first output signal at the first output node and a second output signal at the second output node;
   the gates of the first and second transistor of the second FIR filter component are coupled to the MSB of the first input signal, the gates of the third and fourth transistor of the second FIR filter component are coupled to the MSB of the second input signal, and the second FIR filter component is configured to generate a first output signal at the first output node and a second output signal at the second output node; and
   the gates of the first and second transistor of the third FIR filter component are coupled to a least significant bit (LSB) of the first input signal, the gates of the third and fourth transistor of the third FIR filter component are coupled to an LSB of the second signal, and the third FIR filter component is configured to generate a first output signal at the first output node and a second output signal at the second output node.

* * * * *